United States Patent
Ohmure et al.

(10) Patent No.: US 10,345,404 B2
(45) Date of Patent: Jul. 9, 2019

(54) MAGNETIC RESONANCE IMAGING APPARATUS AND RF COIL APPARATUS

(71) Applicant: Toshiba Medical Systems Corporation, Otawara-shi (JP)

(72) Inventors: Takahiro Ohmure, Otawara (JP); Sadanori Tomiha, Nasushiobara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 172 days.

(21) Appl. No.: 15/387,162

(22) Filed: Dec. 21, 2016

(65) Prior Publication Data

US 2017/0184693 A1 Jun. 29, 2017

(30) Foreign Application Priority Data

Dec. 24, 2015 (JP) ................. 2015-252360

(51) Int. Cl.
| G01V 3/00 | (2006.01) |
| G01R 33/36 | (2006.01) |
| G01R 33/48 | (2006.01) |
| G01R 33/385 | (2006.01) |
| G01R 33/30 | (2006.01) |
| A61B 5/055 | (2006.01) |
| A61B 5/00 | (2006.01) |

(52) U.S. Cl.
CPC ............ G01R 33/36 (2013.01); A61B 5/0555 (2013.01); A61B 5/704 (2013.01); G01R 33/307 (2013.01); G01R 33/385 (2013.01); G01R 33/48 (2013.01)

(58) Field of Classification Search
CPC ........... G03G 15/2053; G03G 15/2028; G03G 15/6573; G03G 15/2085; B65H 2220/01
USPC .......................................................... 324/322
See application file for complete search history.

(56) References Cited

U.S. PATENT DOCUMENTS

| 5,001,428 A | 3/1991 | Maier et al. |
| 2006/0181278 A1* | 8/2006 | Nozaki .............. G01R 33/3415 324/318 |
| 2008/0182524 A1 | 7/2008 | Graesslin et al. |

FOREIGN PATENT DOCUMENTS

| JP | 3-7141 | 1/1991 |
| JP | 3-139330 | 6/1991 |
| JP | 2006-223383 | 8/2006 |
| JP | 2009-501553 | 1/2009 |

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

According to one embodiment, magnetic resonance imaging apparatus includes a transmission coil, a plurality of reception channels, transmission/reception circuitry, and processing circuitry. The transmission coil transmits an RF wave to a subject. The reception channels receive MR signals generated from the subject. The transmission/reception circuitry controls the transmission coil to change the flip angle of a nucleus contained in the subject and excited by the transmitted RF wave. The processing circuitry determines whether the reception channels include an impaired channel, based on the comparison between the distributions of the signal values of the received MR signals with respect to the changing flip angles among the reception channels.

13 Claims, 9 Drawing Sheets

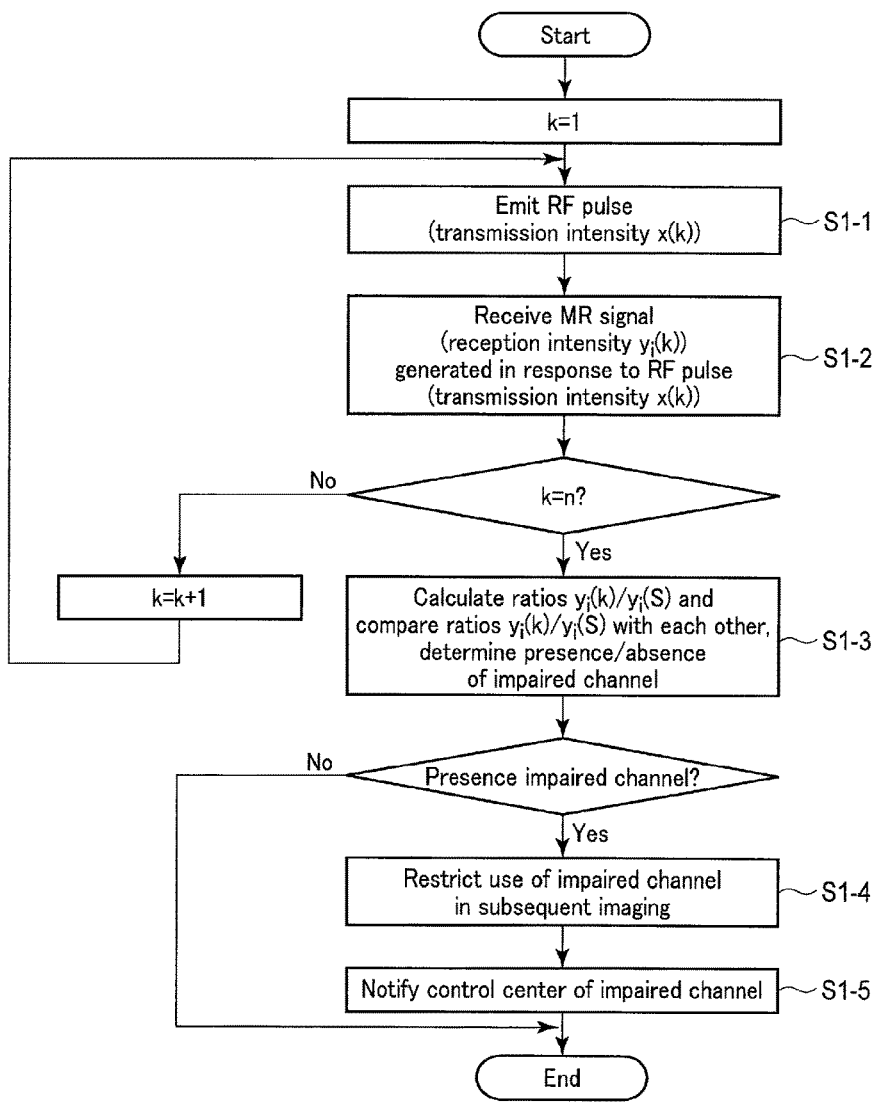
F I G. 2A

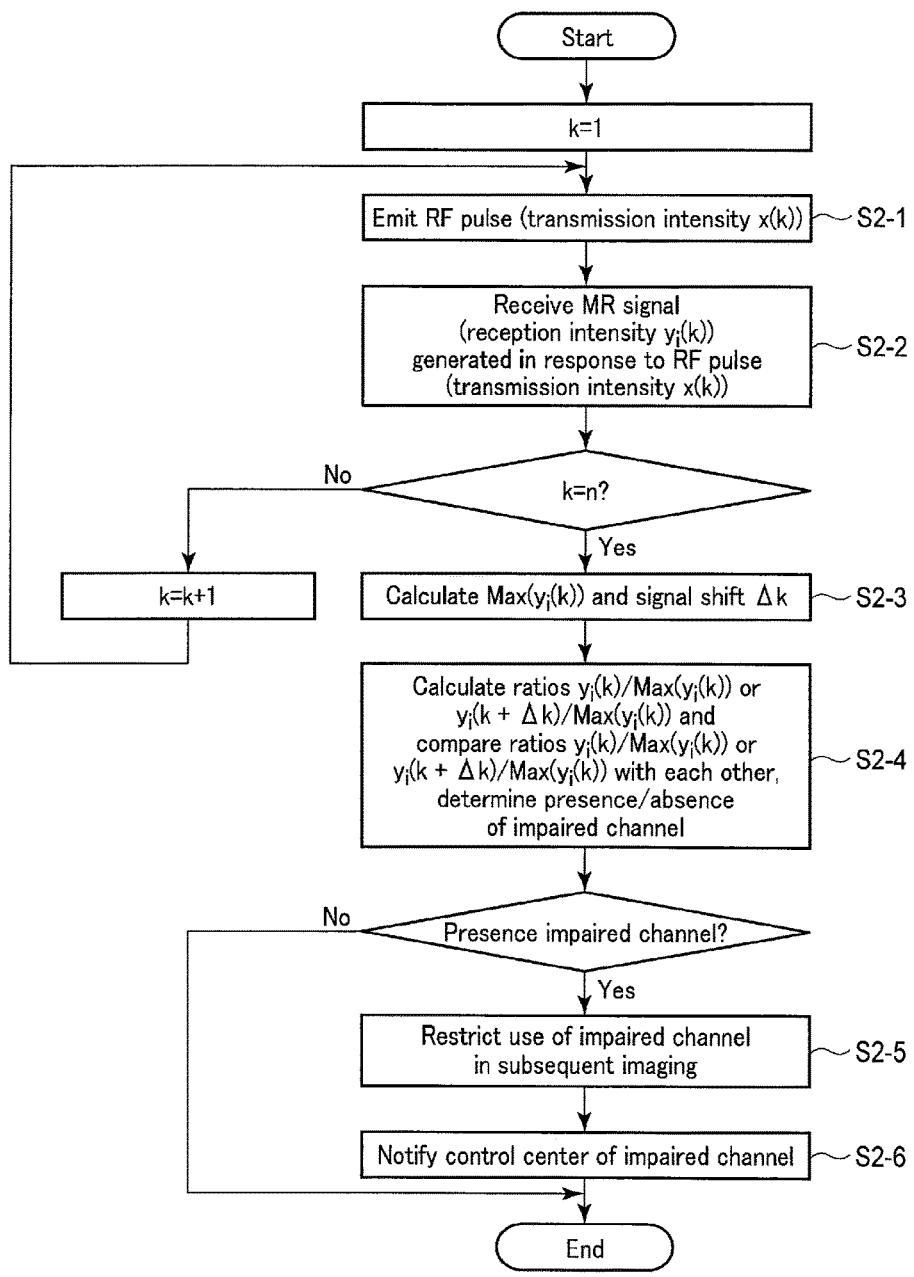
F I G. 3A

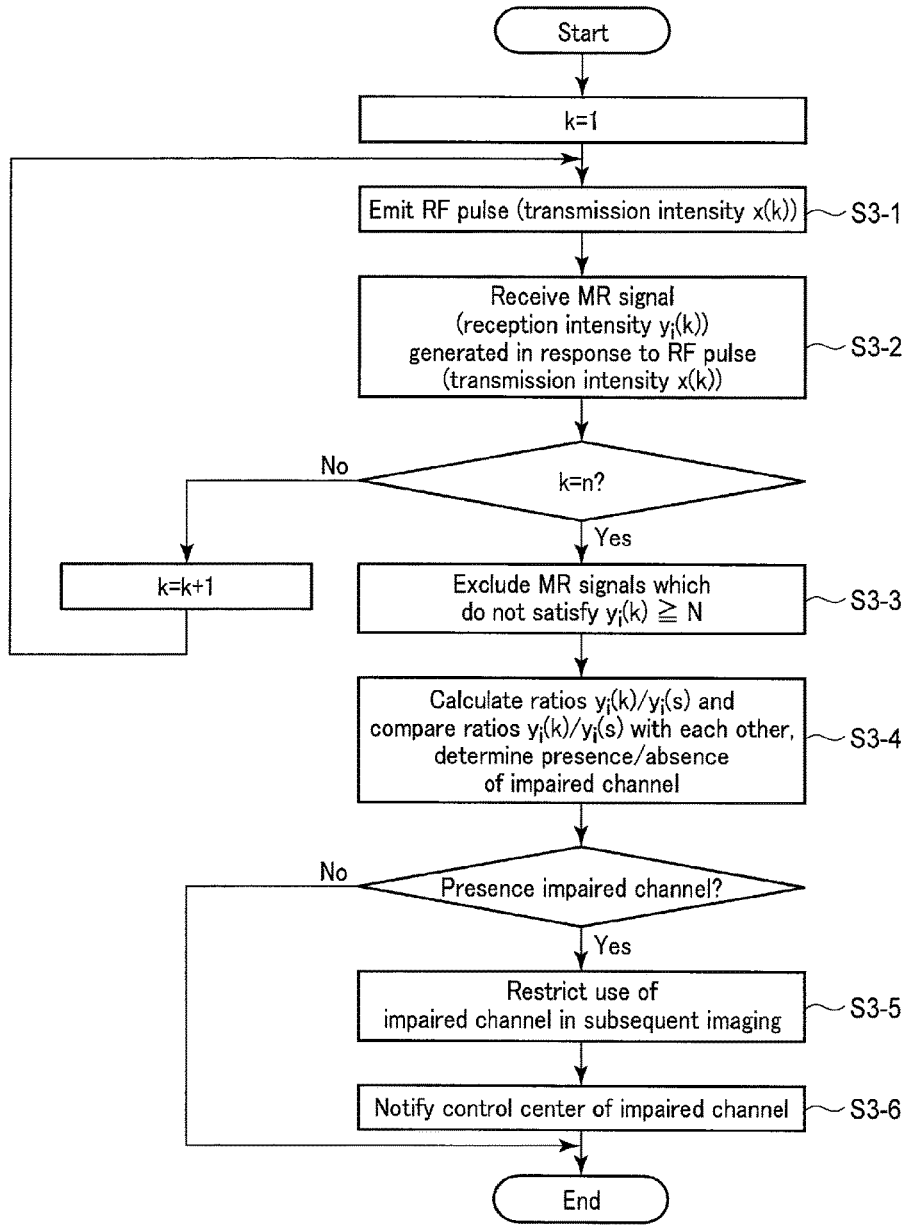
F I G. 4A

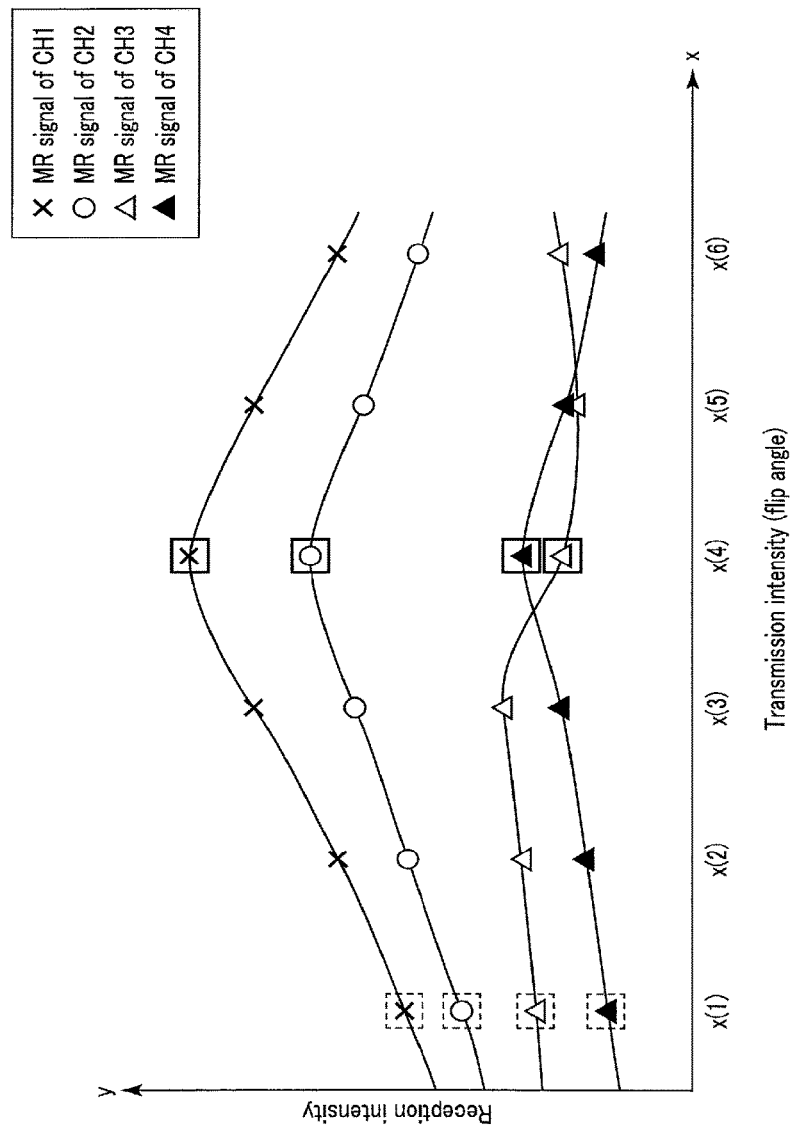
F I G. 5

MAGNETIC RESONANCE IMAGING APPARATUS AND RF COIL APPARATUS

CROSS-REFERENCE TO RELATED APPLICATIONS

This application is based upon and claims the benefit of priority from the prior Japanese Patent Application No. 2015-252360, filed Dec. 24, 2015 the entire contents of which are incorporated herein by reference.

FIELD

Embodiments described herein relate generally to a magnetic resonance imaging apparatus and an RF coil apparatus.

BACKGROUND

An MRI (Magnetic Resonance Imaging) apparatus has become widespread in the field of medical image diagnosis. MRI is an imaging method based on magnetic resonance phenomena, and is an imaging method in which nuclear ($^1$H and the like) spins inside a subject placed in a space in which a static magnetic field is formed are magnetically excited by using RF (Radio Frequency) signals having the Larmor frequency, and an MR image is reconstructed from MR (Magnetic Resonance) signals generated upon excitation.

When executing magnetic resonance imaging, an RF coil unit is used. The RF coil unit transmits RF pulses to nuclear spins inside the subject in response to externally supplied power or current. In addition, the RF coil unit receives MR signals generated from the subject.

A general RF coil unit includes a reception coil constituted by a plurality of coil elements. If at least one coil element breaks down, an MR image reconstructed from MR signals received by the reception coil including the broken coil element contains noise and artifact. This makes it difficult to read an MR image.

BRIEF DESCRIPTION OF THE DRAWING

FIG. 2A is a flowchart showing a procedure for detecting impaired channel according to Example 1 in the magnetic resonance imaging apparatus according to the first embodiment;

FIG. 3A is a flowchart showing a procedure for detecting impaired channel according to Example 2 in the magnetic resonance imaging apparatus according to the first embodiment;

FIG. 4A is a flowchart showing a procedure for detecting impaired channel according to Example 3 in the magnetic resonance imaging apparatus according to the first embodiment;

FIG. 5 is a graph corresponding to FIG. 2B and showing the relationship between transmission intensity and reception intensity when RF waves are continuous waves.

DETAILED DESCRIPTION

A magnetic resonance imaging apparatus according to an embodiment includes a transmission coil, a plurality of reception channels, transmission/reception circuitry, and processing circuitry. The transmission coil transmits an RF wave to a subject. The plurality of reception channels receive MR signals generated from the subject. The transmission/reception circuitry controls the transmission coil to change the flip angle of a nucleus contained in the subject and excited by the transmitted RF wave. The processing circuitry determines whether the plurality of reception channels include an impaired channel, based on the comparison between the distributions of the signal values of the received MR signals with respect to the changing flip angles among the plurality of reception channels.

Embodiments will be described below with reference to the accompanying drawing.

First Embodiment

Figure 1:
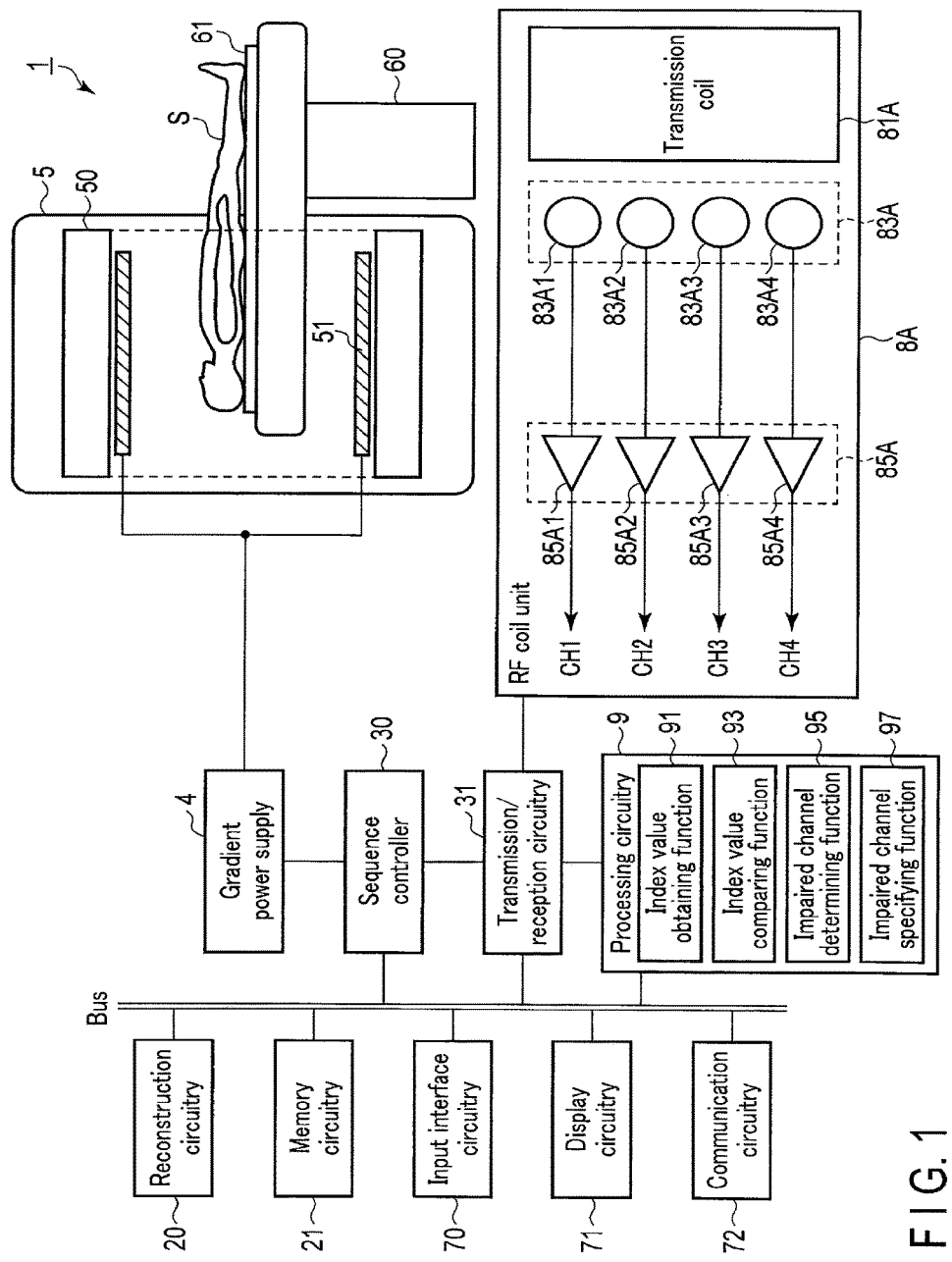
FIG. 1 is a block diagram showing a magnetic resonance imaging apparatus according to the first embodiment.

FIG. 1 is a block diagram showing an example of a magnetic resonance imaging apparatus 1 according to the first embodiment.

The magnetic resonance imaging apparatus 1 according to the first embodiment includes reconstruction circuitry 20, memory circuitry 21, a sequence controller 30, transmission/reception circuitry 31, a gradient power supply 4, a gantry 5, a couch 60, input interface circuitry 70, display circuitry 71, communication circuitry 72, an RF coil unit 8A, and processing circuitry 9.

The gantry 5 is an imaging apparatus formed in a hollow, almost cylindrical shape, on which an imaging mechanism for magnetic resonance imaging is mounted. A subject S is placed in the bore of the gantry 5. The gantry 5 includes a static field magnet 50 and a gradient coil 51.

The static field magnet 50 has a hollow, almost cylindrical shape, and generates a static magnetic field inside the almost cylindrical body. Assume that in the first embodiment, the static field magnet 50 is a superconducting magnet. However, the embodiment can be carried out by using a permanent magnet or normal conducting magnet instead of the superconducting magnet.

The gradient coil 51 is a coil unit mounted inside the static field magnet 50 and formed in a hollow, almost cylindrical shape. The gradient coil 51 forms a desired gradient magnetic field in response to a transmission driving signal from the gradient power supply 4. Although not shown for the sake of simplicity, the gradient coil 51 is actually formed by combining three coils corresponding to the X-, Y-, and Z-axes which are perpendicular to each other. The three coils form gradient magnetic fields whose magnetic field intensities change along the X-, Y-, and Z-axes. For example, a gradient magnetic field along the Z-axis corresponds to a slice selection gradient magnetic field Gs, a gradient magnetic field along the Y-axis corresponds to a phase encoding gradient magnetic field Ge, and a gradient magnetic field along the X-axis corresponds to a readout gradient magnetic field Gr. The slice selection gradient magnetic field Gs is used to arbitrarily determine an imaging slice. The phase encoding gradient magnetic field Ge is used to change the phase of an MR signal in accordance with a spatial position.

The readout gradient magnetic field Gr is used to change the frequency of an MR signal in accordance with a spatial position.

The gradient power supply 4 is arranged outside the gantry 5. The gradient power supply 4 applies a current to the gradient coil 51 under the control of the sequence controller 30.

The couch 60 includes a table top 61 on which the subject S is to be placed. The table top 61 is driven by, for example, an electromagnetic motor (not shown) to horizontally move in the longitudinal direction. Referring to FIG. 1, the magnetic resonance imaging apparatus 1 according to the first embodiment is implemented by using the couch 60 fixed in an imaging room. However, this is not exhaustive. For example, the magnetic resonance imaging apparatus 1 according to the first embodiment may be implemented by using the gantry 5 and the detachable and mobile couch 60. In this case, for example, the couch 60 includes casters (not shown). Using the casters allows an operator such as a doctor to move the couch 60. In addition, the magnetic resonance imaging apparatus 1 according to the first embodiment may be implemented such that, for example, an electromagnetic motor (not shown) supplies driving power to the casters to allow the operator to move or help the operator to move the couch 60 using the driving power.

The transmission/reception circuitry 31 is connected to the sequence controller 30, the RF coil unit 8A, and the processing circuitry 9. The transmission/reception circuitry 31 has a transmission function and a reception function. With the transmission function, the transmission/reception circuitry 31 transmits a transmission driving signal to the RF coil unit 8A under the control of the sequence controller 30. Upon reception of the transmission driving signal, the RF coil unit 8A generates an RF wave. More specifically, the transmission/reception circuitry 31 controls the transmission coil 81A to change the flip angle of a nucleus in the subject S which is excited by the RF wave transmitted from the transmission coil 81A. An RF wave is, for example, a pulse wave or continuous wave. With the reception function, the transmission/reception circuitry 31 receives an MR signal from the RF coil unit 8A under the control of the sequence controller 30. Note that the transmission/reception circuitry 31 may be implemented by single hardware circuitry having a transmission function and a reception function or transmission circuitry having a transmission function and reception circuitry having a reception function which are physically separated from each other. Note that the transmission/reception circuitry 31 transmits an MR signal to the processing circuitry 9 in association with detecting impaired channel (to be described later). A transmission driving signal and an MR signal may be transmitted and received by, for example, wireless communication or wired communication using a cable or the like.

The RF coil unit 8A is connected to the transmission/reception circuitry 31. The RF coil unit 8A transmits an RF wave upon reception of a transmission driving signal from the transmission/reception circuitry 31, and receives an MR signal from the subject S. The RF coil unit 8A includes, for example, a transmission coil 81A, a reception coil 83A, and amplifying circuitry 85A.

The transmission coil 81A transmits an RF wave in response to the input of a transmission driving signal from the transmission/reception circuitry 31. An RF wave will be described as, for example, an RF pulse unless otherwise specified. An RF pulse excites a nucleus in the subject S which corresponds to the intrinsic Larmor frequency. The flip angle of a nucleus to be excited is determined in accordance with the transmission intensity of an RF pulse. A transmission intensity is determined by, for example, the product of a transmission magnetic field strength and a time.

More specifically, the transmission/reception circuitry 31 controls the transmission coil 81A to change the flip angle of a nucleus excited by an RF wave transmitted from the transmission coil 81A. When an RF wave is a continuous wave, an RF wave having a predetermined magnetic field strength is transmitted only for a time corresponding to a transmission intensity. A transmission time is variable in accordance with a transmission intensity. When an RF wave is a pulse wave, an RF wave having a transmission magnetic field strength corresponding to a transmission intensity is transmitted only for a predetermined time. A transmission magnetic field strength is variable in accordance with a transmission intensity. In other words, the transmission/reception circuitry 31 controls the transmission coil 81A to transmit a plurality of RF waves having a plurality of transmission intensities from the transmission coil 81A.

The reception coil 83A includes a plurality of coil elements 83Ai. The letter "i" indicates the number of a coil element 83Ai. The number of coil elements 83Ai is not specifically limited as long as it is two or more. The reception coil 83A receives, for the respective coil elements 83Ai, MR signals generated when nuclei contained in the subject S return from excited states. In general, when the flip angle of a nucleus to be excited is about 90°, the reception intensity of an MR signal becomes the maximum.

The amplifying circuitry 85A includes a plurality of amplifying elements 85Ai. The letter "i" indicates the number of an amplifying element 85Ai. The number of amplifying elements 85Ai is not specifically limited as long as it is two or more. The amplifying circuitry 85A amplifies MR signals from the reception coil 83A for the respective amplifying elements 85Ai. The amplifying circuitry 85A transmits the amplified MR signals to the transmission/reception circuitry 31 for the respective amplifying elements 85Ai. Alternatively, the amplifying circuitry 85A combines the amplified MR signals using some of the plurality of amplifying elements 85Ai, and transmits the resultant signal to the transmission/reception circuitry 31.

As shown in FIG. 1, the RF coil unit 8A includes a plurality of reception channels CHi in a parallel pattern. Each reception channel CHi includes the coil element 83Ai and the amplifying circuitry 85Ai connected in series. Each coil element 83Ai receives an MR signal from the subject S. Each amplifying circuitry 85Ai amplifies the MR signal from the corresponding coil element 83Ai as a connection source. Each amplified MR signal is supplied to the transmission/reception circuitry 31 via a cable (not shown).

The first embodiment will be described assuming that the coil elements 83Ai one-to-one correspond to the reception channels CHi, as shown in FIG. 1. However, the RF coil unit 8A may be arranged so as to combine some of a plurality of MR signals received by the coil elements 83Ai and make the plurality of coil elements 83Ai correspond to one reception channel CHi in a many-to-one manner. That is, the number of coil elements 83Ai may be equal to or different from that of reception channels CHi.

Note that the RF coil unit 8A shown in FIG. 1 has the transmission coil 81A and the reception coil 83A accommodated in the same housing. However, the transmission coil 81A and reception coil 83A need not be accommodated in the same housing. In addition, the transmission coil 81A and the reception coil 83A may be physically the same coil or different coils. For example, for a body coil or head coil, the transmission coil 81A and the reception coil 83A can be formed as physically the same coil which can perform both transmission and reception. Note that the body coil is an RF coil accommodated in the gantry 5. In contrast to this, for example, the transmission coil 81A and the reception coil 83A can be formed as physically different coils by using a body coil and a surface coil as the transmission coil 81A and the reception coil 83A, respectively.

The sequence controller 30 is connected to the transmission/reception circuitry 31 and the gradient power supply 4. The sequence controller 30 synchronously controls the transmission/reception circuitry 31 and the gradient power supply 4 in accordance with sequence information corresponding to a predetermined scan sequence. For example, when performing a pre-scan, the sequence controller 30 synchronously controls the transmission/reception circuitry 31 and the gradient power supply 4 in accordance with sequence information corresponding to a scan sequence for detecting impaired channel (to be described later). The transmission/reception circuitry 31 controls the transmission coil 81A to individually transmit a plurality of RF pulses having different transmission intensities under the control of the sequence controller 30. The reception coil 83A receives a plurality of MR signals respectively corresponding to the plurality of RF pulses having the different transmission intensities for the respective coil elements 83Ai. A pre-scan is performed to, for example, generate a locator image, perform shimming, or generate a sensitivity map. A pre-scan is executed before a main scan for obtaining a desired MR image in a subject. A pre-scan is executed to perform, for example, the calibration of various types of parameters for imaging conditions to be used for a main scan. In addition, the sequence controller 30 synchronously controls the transmission/reception circuitry 31 and the gradient power supply 4 in accordance with sequence information corresponding to a scan sequence for a predetermined main scan.

The reconstruction circuitry 20 includes, as hardware resources, a processor such as a CPU (Central Processing Unit), GPU (Graphical Processing Unit), or MPU (Micro Processing Unit) and memories such as a ROM (Read Only Memory) and a RAM (Random Access Memory). The reconstruction circuitry 20 reconstructs an MR image associated with the subject S based on MR signals from the transmission/reception circuitry 31. For example, the reconstruction circuitry 20 generates an MR image defined in a real space by applying a Fourier transform or the like to MR signals arranged in a k-space or frequency space.

The input interface circuitry 70 receives an instruction from an operator such as a doctor via a user interface such as a switch button, mouse, or keyboard. The instruction is transferred to the reconstruction circuitry 20. The processing circuitry 9 executes predetermined control or computation in accordance with the instruction.

The display circuitry 71 displays a screen of a GUI (Graphic User Interface). The display circuitry 71 is implemented as a display device such as a CRT display, liquid crystal display, organic EL display, or plasma display. The display device displays, for example, an MR image stored in the memory circuitry 21 on a GUI screen in response to predetermined control by the processing circuitry 9. Alternatively, in association with the display circuitry 71, a printer (not shown) may be used, as needed, which can print a display screen or the like on the above display device.

The communication circuitry 72 is connected to a wired network or wireless network. That is, the magnetic resonance imaging apparatus 1 according to the first embodiment is connected to an external device or the like via the communication circuitry 72. For example, the magnetic resonance imaging apparatus 1 according to the first embodiment is connected to an HIS (Hospital Information System) in hospital facilities.

The magnetic resonance imaging apparatus 1 according to the first embodiment can also transmit information about a reception channel having defect in an RF coil (to be described later) to a facility outside the magnetic resonance imaging apparatus 1 via the communication circuitry 72. A facility outside the magnetic resonance imaging apparatus 1 is, for example, a control center operated by a maker which manufactures and sells the magnetic resonance imaging apparatus 1.

The memory circuitry 21 stores a protocol associated with magnetic resonance imaging, a plurality of parameters included in the protocol, and combinations of the values of the parameters (imaging conditions). The memory circuitry 21 also stores examination information associated with the subject S. The examination information includes, for example, an examination date, patient number (ID), sex, name, birth date, height, weight, examination region, inserting direction, body position, reception coil to be used, attachment position of reception coil, execution/non-execution and type of gating of biological signal, and use/non-use and type of contrast medium. The memory circuitry 21 also stores an impaired channel detection program (to be described later).

The memory circuitry 21 is implemented as, for example, a storage device such as an HDD (Hard Disk Drive) or SSD (Solid State Drive). The memory circuitry 21 may also be implemented as a memory such as a RAM (Random Access Memory) which stores information temporarily required for program computation, for example, arguments and arrays.

In addition, the magnetic resonance imaging apparatus 1 according to the first embodiment may include a read/write unit (not shown) which reads information from a recording medium and writes information in the recording medium. The recording medium may be any type of medium as long as it is a removable medium. For example, when the recording medium is an optical medium such as a CD (Compact Disc) or DVD (Digital Versatile Disc), the read/write unit is implemented as an optical drive. Alternatively, when the recording medium is a magneto-optical medium such as an MO disk (Magneto-Optical Disc), the read/write unit is implemented as a magneto-optical drive.

The read/write unit can move or copy an MR image stored in the memory circuitry 21 to a recording medium. In addition, the read/write unit can move or copy an MR image stored in the recording medium to the memory circuitry 21.

The processing circuitry 9 functions as the main unit of the magnetic resonance imaging apparatus 1. For example, the processing circuitry 9 controls each unit to execute a main scan. In addition, the processing circuitry 9 controls each unit to execute a pre-scan before a main scan. The processing circuitry 9 includes, as hardware resources, a processor such as a CPU or MPU and memories such as a ROM and a RAM.

The processing circuitry 9 according to this embodiment executes an impaired channel detection program stored in the memory circuitry 21 or the like. The processing circuitry 9 executes the impaired channel detection program to execute impaired channel detection processing for detecting defect in the plurality of reception channels CHi. When executing impaired channel detection processing, the processing circuitry 9 determines whether the plurality of reception channels include an impaired channel, based on the comparison between the distributions of the signal values of MR signals with respect to flip angles among the plurality of reception channels CHi. In other words, the processing circuitry 9 determines whether the plurality of reception channels include an impaired channel, based on the comparison between the distributions of the signal values of MR signals with respect to a plurality of transmission intensities among the plurality of reception channels CHi. Impaired channel detection processing is executed in, for example, a pre-scan. In particular, it is preferable to execute impaired channel detection processing before a protocol accompanying, for example, the obtaining of an image such as a locator image. In addition, as a pre-scan for the execution of impaired channel detection processing, a scan for RF level checking may be performed.

The processing circuitry 9 for impaired channel detection processing implements an index value obtaining function 91, an index value comparing function 93, an impaired channel determining function 95, and an impaired channel specifying function 97. Note that the index value obtaining function 91, the index value comparing function 93, the impaired channel determining function 95, and the impaired channel specifying function 97 may be implemented by impaired channel detection program modules or individual programs.

By executing the index value obtaining function 91, the processing circuitry 9 obtains a plurality of index values respectively corresponding to a plurality of MR signals received by the RF coil unit 8A for the respective reception channels CHi. In this case, an index value according to this embodiment is that associated with the reception intensity of an MR signal and may be a reception intensity itself or the ratio (change ratio) of a reception intensity as a processing target to a reference reception intensity. The above index value will be referred to as a reception intensity index value hereinafter.

By executing the index value comparing function 93, the processing circuitry 9 compares the reception intensity index values of a plurality of MR signals associated with a plurality of different transmission intensities throughout the respective reception channels CHi.

By executing the impaired channel determining function 95, the processing circuitry 9 determines whether the plurality of reception channels CHi include the reception channel CHi having defect, based on the comparison executed by the index value comparing function 93. A reception channel having defect will be referred to as an impaired reception channel hereinafter.

When the plurality of reception channels CHi include the impaired reception channel CHi, the processing circuitry 9 executes the impaired channel specifying function 97 to specify the impaired reception channel CHi among the plurality of reception channels CHi based on the comparison executed by the index value comparing function 93.

Impaired cannel detection processing by the magnetic resonance imaging apparatus 1 according to the first embodiment will be described below separately in a plurality of examples.

Example 1

FIG. 2A is a flowchart showing a procedure for Example 1 of impaired channel detection processing by the magnetic resonance imaging apparatus according to the first embodiment. Assume that a pre-scan in which impaired channel detection processing is executed is a scan for RF level checking. RF level checking is performed to specify a transmission intensity for setting the flip angle of a nucleus to 90°. More specifically, the transmission/reception circuitry 31 controls the transmission coil 81A to transmit RF pulses with different transmission intensities. The magnetization vector of the spin of a nucleus which has received an RF pulse tilts by a flip angle corresponding to the transmission intensity to generate an MR signal having a reception intensity corresponding to the flip angle. For example, as a transmission intensity increases, the flip angle increases. The plurality of reception channels CHi receive generated MR signals. When the flip angle is 90°, the reception intensity of the MR signal becomes the maximum. The processing circuitry 9 specifies the maximum reception intensity among the reception intensities of a plurality of received signals, and specifies a transmission intensity corresponding to the specified maximum reception intensity as a transmission intensity corresponding to a flip angle of 90°. Impaired channel detection processing according to this embodiment in RF level checking will be described below.

Note that k is a natural number satisfying 1≤k≤n (n is a natural number). Processes associated with steps S1-1 and S1-2 are sequentially repeated with respect to transmission intensities so as to satisfy $$x(k) < x(k+1) \text{ (where } k \leq n-1\text{)}$$

in the order of k=1, . . . , n. That is, the transmission/reception circuitry 31 sequentially transmits RF pulses having the first to nth transmission intensities via the transmission coil 81A under the control of the sequence controller 30 based on scan sequence information for impaired channel detection processing. For example, a (k+1)th transmission intensity $x(k+1)$ is set to be higher than a kth transmission intensity $x(k)$. For the sake of simplicity, Example 1 will describe a case in which n=6.

(Step S1-1)

The transmission/reception circuitry 31 applies a transmission driving signal for the kth transmission intensity $x(k)$ to the transmission coil 81A under the control of the sequence controller 30 based on scan sequence information for impaired channel detection processing. Upon reception of the transmission driving signal, the transmission coil 81A transmits an RF pulse having the kth transmission intensity $x(k)$.

(Step S1-2)

The reception coil 83A receives an MR signal originating from the RF pulse having the transmission intensity $x(k)$ for each coil element 83Ai. The MR signal received by the coil element 83Ai is supplied to the processing circuitry 9 via the transmission/reception circuitry 31 for each reception channel CHi. In this case, the reception intensity of an MR signal from the reception channel CHi to which the ith coil element belongs is written as $y_i(k)$. In other words, in Example 1, the reception intensity of an MR signal from a reception channel CH1 to which a first coil element 83A1 belongs is written as $y_1(k)$, the reception intensity of an MR signal from a reception channel CH2 to which a second coil element 83A2 belongs is written as $y_2(k)$, the reception intensity of an MR signal from a reception channel CH3 to which a third coil element 83A3 belongs is written as $y_3(k)$, and the reception intensity of an MR signal from a reception channel CH4 to which a fourth coil element 83A4 belongs is written as $y_4(k)$.

Figure 2B:
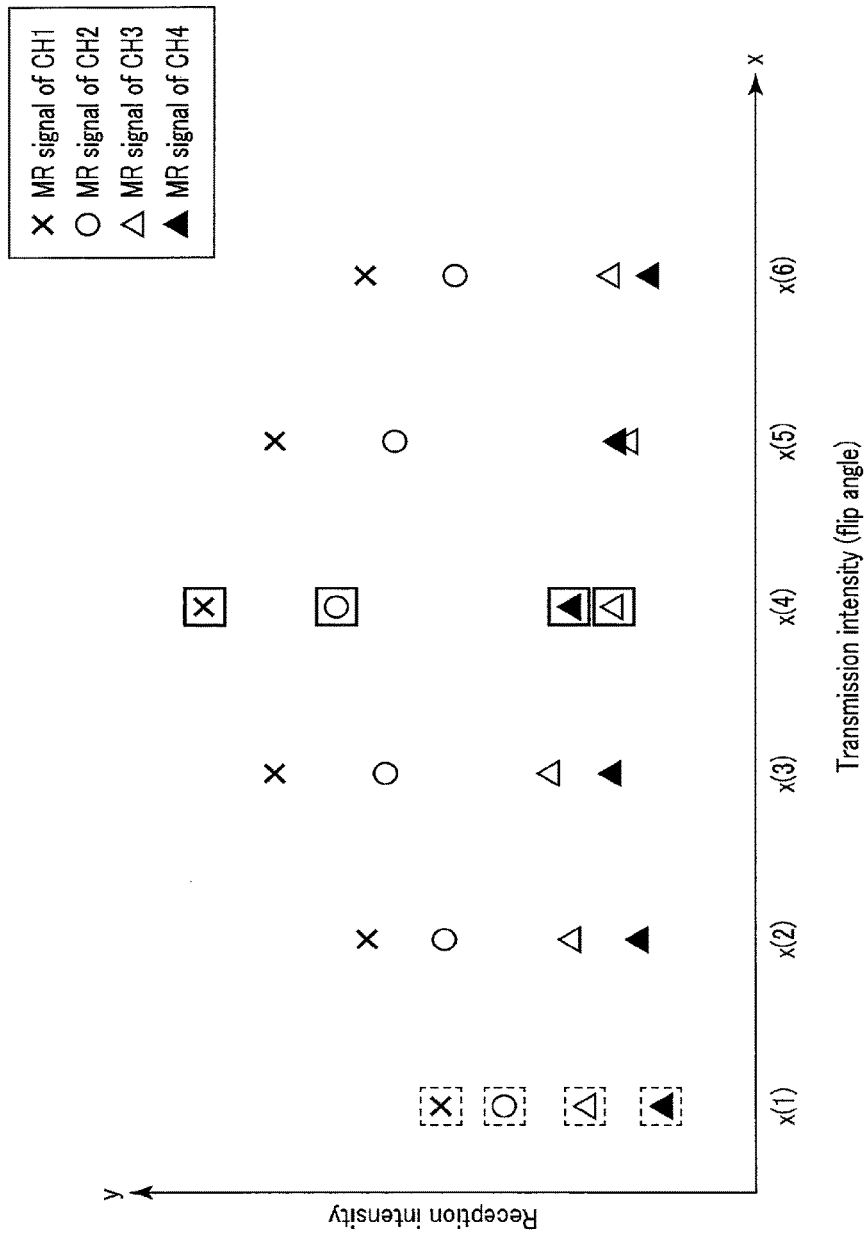
FIG. 2B is a graph showing the relationship between transmission intensity and reception intensity in association with Example 1.

FIG. 2B is a graph showing the relationship between the transmission intensities of RF pulses from the transmission coil 81A and the reception intensities of MR signals received by the respective reception channels CHi in association with Example 1 associated with impaired channel detection processing. Referring to FIG. 2B, the abscissa is defined as a transmission intensity x, and the ordinate is defined as a reception intensity y. As shown in FIG. 2B, upon execution of a scan sequence for impaired channel detection processing, the processing circuitry 9 records the reception intensities y of MR signals from the reception channels CHi for each transmission intensity x(k).

(Step S1-3)

The processing circuitry 9 calculates the reception intensity index values of MR signals for each transmission intensity x(k), i.e., each flip angle, with respect to the respective reception channels CHi. In this example, a reception intensity index value is defined as the ratio of the reception intensity of an MR signal associated with each transmission intensity to a reference reception intensity. Note that in this embodiment, "the reception intensity of an MR signal associated with a given transmission intensity" indicates the reception intensity of an MR signal originating from an RF pulse having the given transmission intensity. In this example, a reference reception intensity can be set to the reception intensity of an MR signal associated with the arbitrary kth transmission intensity. For example, referring to FIG. 2B, a reference reception intensity is set to the reception intensity of an MR signal associated with a first transmission intensity x(1).

More specifically, the processing circuitry 9 calculates ratios $y_i(k)/y_i(S)$ of the reception intensities $y_i(k)$ of MR signals associated with each transmission intensity x(k) to reference reception intensities $y_i(S)$ with respect to the respective reception channels CHi. For example, when calculating reception intensity index values associated with the respective reception channels CHi with respect to a fourth transmission intensity x(4), the processing circuitry 9 specifies the reference reception intensities $y_i(1)$ and reception intensities $y_i(4)$ of MR signals associated with the transmission intensity x(4) with respect to the respective reception channels CHi, and calculates ratios $y_1(4)/y_1(1)$ of the reception intensities $y_i(4)$ to the reference reception intensities $y_i(1)$ as the reception intensity index values of the MR signals associated with the transmission intensity x(4). For example, the processing circuitry 9 calculates $y_1(4)/y_1(1)$ as the reception intensity index value of an MR signal associated with the transmission intensity x(4) of the reception channel CH1, $y_2(4)/y_2(1)$ as the reception intensity index value of an MR signal associated with the transmission intensity x(4) of the reception channel CH2, $y_3(4)/y_3(1)$ as the reception intensity index value of an MR signal associated with the transmission intensity x(4) of the reception channel CH3, and $y_4(4)/y_4(1)$ as the reception intensity index value of an MR signal associated with the transmission intensity x(4) of the reception channel CH4.

The processing circuitry 9 compares the plurality of reception intensity index values (ratios) $y_i(k)/y_i(S)$ associated with a plurality of reception channels CHi for each transmission intensity x(k). For example, in the case of the above four reception channels CHi, the processing circuitry 9 compares $y_1(k)/y_1(S)$, $y_2(k)/y_2(S)$, $Y_3(k)/y_3(S)$, and $y_4(k)/y_4(S)$. If there is no impaired channel in any of the reception channels CHi, all the reception intensity index values are ideally equal to each other. However, since some error occurs in practice, an error allowable range is preferably decided in advance. The processing circuitry 9 compares the reception intensity index values of the plurality of reception channels CHi. If all the reception intensity index values fall within the preset error allowable range, the processing circuitry 9 determines that there is no impaired channel in the plurality of reception channels CHi. If all the reception intensity index values include a reception intensity index value which falls outside the error allowable range, the processing circuitry 9 determines that the plurality of reception channels CHi include an impaired channel. The error allowable range can be set within an arbitrary numerical value range.

Upon determining that there is an impaired channel, the processing circuitry 9 specifies the reception channel CHi associated with the reception intensity index value which falls outside the error allowable range as an impaired channel. For example, in the case shown in FIG. 2B, the processing circuitry 9 compares the ratios $y_1(4)/y_1(1)$, $y_2(4)/y_2(1)$, $y_3(4)/y_3(1)$, and $y_4(4)/y_4(1)$. As shown in FIG. 2B, $y_1(4)/y_1(1)$, $y_2(4)/y_2(1)$, and $y_4(4)/y_4(1)$ are almost equal to each other, but $y_3(4)/y_3(1)$ differs from $y_1(4)/y_1(1)$, $y_2(4)/y_2(1)$, and $y_4(4)/y_4(1)$ by a degree exceeding the error allowable range. The processing circuitry 9 therefore specifies the reception channel CH3 as an impaired channel. When the reception channels CHi one-to-one correspond to the coil elements 83Ai, it is possible to uniquely specify the coil element 83Ai belonging to the impaired channel.

If no impaired channel is specified, steps S1-4 and S1-5 are skipped.

(Step S1-4)

In a scan sequence after the scan sequence for impaired channel detection processing, the use of the impaired channel is limited. As shown in FIG. 1, each reception channel CHi includes at least the coil element 83Ai and the amplifying circuitry 85Ai. The coil element 83Ai belonging to each reception channel CHi of the RF coil unit 8A receives an MR signal, and the amplifying circuitry 85Ai as a connection destination processes the signal. The transmission/reception circuitry 31 receives the signal via a cable (not shown). That is, if it is determined that a given reception channel has defect, the coil element 83Ai belonging to the impaired reception channel CHi, the above amplifying circuit, the above cable, or the like may have impaired channel. If, therefore, for example, the third reception channel has impaired channel when the reception channels CHi one-to-one correspond to the coil elements 83Ai, it is preferable to limit the use of the third coil element belonging to the third reception channel. If the third reception channel has impaired channel when the reception channels CHi one-to-many correspond to the coil elements 83Ai, it is preferable to limit the use of a plurality of coil elements belonging to the third reception channel. As a technique for the above limiting operation, for example, it is preferable to use a technique of making the reconstruction circuitry 20 execute reconstruction processing without using any MR signal from the impaired channel CHi. Alternatively, an MR signal from CH3 may be electrically cut off using an electronic switch or the like.

(Step S1-5)

The communication circuitry 72 notifies the control center of information about the impaired. The display circuitry 71 may display the information about the impaired channel. If there is no impaired channel, the communication circuitry 72 may notify the control center of the corresponding determination result or the display circuitry 71 may display the determination result.

[Modification]

As described above, in Example 1, the processing circuitry 9 calculates the ratios of the reception intensities of MR signals associated with each transmission intensity to the reference reception intensities with respect to the respective reception channels CHi. That is, a reference reception intensity is fixed for each reception channel CHi. However, this is not exhaustive. For example, a reference reception intensity may be set to the reception intensity of an MR signal associated with a transmission intensity preceding or succeeding the transmission intensity associated with a processing target MR signal by a predetermined number of transmissions. If, for example, a reference reception intensity is the reception intensity of an MR signal associated with a transmission intensity immediately preceding the transmission intensity as a processing target, the ratio of the reception intensity is represented by $y_i(k+1)/y_i(k)$ ($k \neq 6$), Even in such a case, the ratio of the reception intensity is used as a reception intensity index value for specifying an impaired channel.

As described above, in Example 1, the communication circuitry 72 notifies the control center of information about an impaired channel. However, this is not exhaustive. For example, the display circuitry 71 may display the information to notify an operator such as a doctor of the information. In such a case, the operator such as the doctor can make, for example, contact with the control center based on his/her own judgement.

As described above, the magnetic resonance imaging apparatus 1 according to Example 1 performs impaired detection processing with respect to all the reception channels CHi included in the RF coil unit 8A. However, this is not exhaustive. For example, the apparatus may execute impaired channel detection processing with respect to some reception channels CHi included in the RF coil unit 8A.

As described above, in Example 1, the transmission coil 81A sequentially transmits RF pulses so as to increase the transmission intensity stepwise from the first transmission intensity to the kth transmission intensity in steps S1-2 and S1-3 in the impaired channel processing. However, the transmission coil 81A sequentially transmits RF pulses so as to decrease the transmission intensity stepwise from the kth transmission intensity to the first transmission intensity.

As described above, in Example 1, the ratios of reception intensities associated with a processing target transmission intensity to reception intensities associated with the reference transmission intensity are used as reception intensity index values. However, this is not exhaustive. For example, the processing circuitry 9 may calculate, as reception intensity index values, the ratios of reception intensities associated with a processing target transmission intensity to a preset reference values. These reference values can be set to arbitrary values.

Example 2

FIG. 3A is a flowchart showing a procedure for processing in Example 2 of impaired channel detection processing by the magnetic resonance imaging apparatus according to the first embodiment. Example 2 takes signal shifts into consideration in addition to Example 1.

Note that k is a natural number satisfying $1 \leq k \leq n$ (n is a natural number). Processes associated with steps S2-1 and S2-2 are sequentially repeated with respect to transmission intensities, as in steps S1-1 and S1-2 in Example 1, so as to satisfy $x(k) < x(k+1)$ (where $k \leq n-1$)

in the order of k=1, . . . , n. For the sake of simplicity, Example 2 will describe a case in which n=6.
(Step S2-1)
The transmission/reception circuitry 31 applies a transmission driving signal for a kth transmission intensity x(k) to the transmission coil 81A under the control of the sequence controller 30 based on scan sequence information for impaired channel detection processing. Upon reception of the transmission driving signal, the transmission coil 81A transmits an RF pulse having the kth transmission intensity x(k).
(Step S2-2)
The reception coil 83A receives an MR signal originating from the RF pulse having the transmission intensity x(k) for each coil element 83Ai.

Figure 3B:
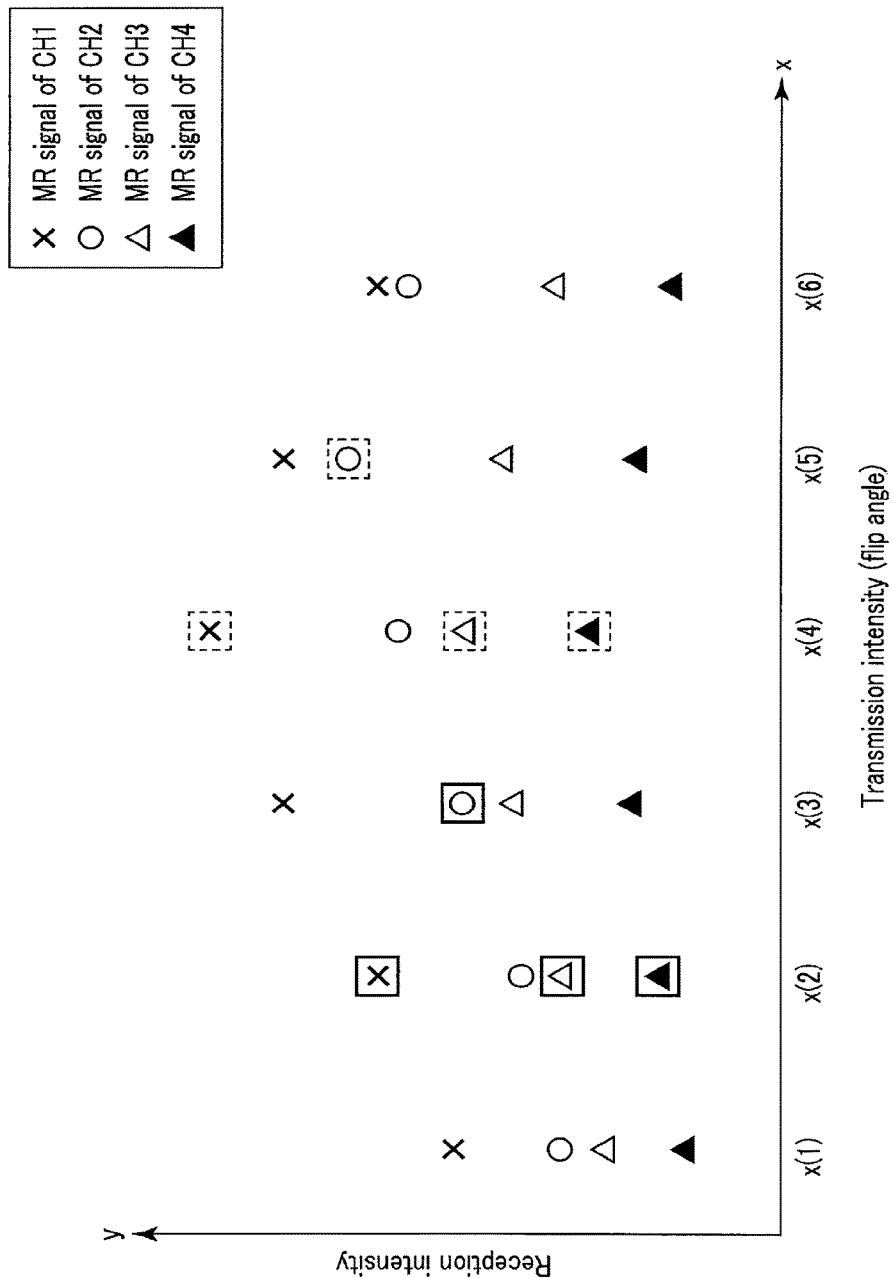
FIG. 3B is a graph showing the relationship between transmission intensity and reception intensity in association with Example 2.

FIG. 3B is a graph showing the relationship between the transmission intensities of RF pulses from the transmission coil 81A and the reception intensities of MR signals received by the respective reception channels CHi in association with impaired channel detection processing in Example 2. Referring to FIG. 3B, the abscissa is defined as a transmission intensity x, and the ordinate is defined as a reception intensity y. As shown in FIG. 3B, upon execution of a scan sequence for impaired channel detection processing, the processing circuitry 9 records the reception intensities y of MR signals from the reception channels CHi for each transmission intensity x(k).
(Step S2-3)
The processing circuitry 9 calculates Max($y_i(k)$) as the maximum value (to be referred to as the maximum reception intensity hereinafter) among reception intensities $y_i(k)$ for each reception channel CHi based on the reception intensities of a plurality of received MR signals. That is, the maximum reception intensity is set as a reference reception intensity. In the case shown in FIGS. 3A and 3B, a maximum reception intensity Max($y_1(k)$) of a reception channel CH1 is a reception intensity $y_1(4)$ associated with a transmission intensity x(4), a maximum reception intensity Max($y_2(k)$) of a reception channel CH2 is a reception intensity $y_2(5)$ associated with a transmission intensity x(5), a maximum reception intensity Max($y_3(k)$) of a reception channel CH3 is a reception intensity $y_3(4)$ associated with the transmission intensity x(4), and a maximum reception intensity Max($y_4(k)$) of a reception channel CH4 is a reception intensity $y_4(4)$ associated with the transmission intensity x(4). Assume that MR signals corresponding to these maximum reception intensities will be referred to as peak signals. Under a homogenous magnetic field B1, RF pulses which provide peak signals are ideally equal in transmission intensity. If, however, the magnetic field B1 is inhomogeneous, such a peak signal shift occurs. For example, in the case shown in FIG. 3B, although peak signals are generated in the reception channels CH1, CH3, and CH4 at the transmission intensity x(4), a peak signal is generated in the reception channel CH2 at the transmission intensity x(5). That is, in the reception channel CH2, a signal shift corresponding to $\Delta k$ (=5−4=1) has occurred. In such a case, signal intensity ratios are compared with each other with reference to each peak signal in each reception channel CHi in consideration of a signal shift.
(Step S2-4)
The processing circuitry 9 calculates the reception intensity index values of MR signals for each transmission intensity x(k) with respect to the respective reception channels CHi. In this example, each reception intensity index value is defined as the ratio of the reception intensity of an MR signal associated with each transmission intensity to the maximum reception intensity. In addition, the processing circuitry 9 corrects a reception intensity index value with respect to each reception channel CHi in accordance with the presence/absence of a signal shift. If there is no signal shift $\Delta k$, the processing circuitry 9 calculates the ratio by dividing the reception intensity $y_i(k)$ of an MR signal associated with the transmission intensity x(k) by the maximum reception intensity $Max(y_i(k))$. If there is the signal shift $\Delta k$, the processing circuitry 9 calculates the ratio by dividing a reception intensity $y_1(k+\Delta k)$ of an MR signal associated with a transmission intensity $x(k+\Delta k)$ by the maximum reception intensity $Max(y_i(k))$. More specifically, when calculating the ratio corresponding to the kth transmission intensity $x(k)$, if there is no signal shift $\Delta k$, the processing circuitry 9 calculates the kth ratio by dividing the reception intensity $y_i(k)$ of an MR signal associated with the kth transmission intensity $x(k)$ by the maximum reception intensity $Max(y_i(k))$. If there is the signal shift $\Delta k$, the processing circuitry 9 calculates the kth ratio by dividing the reception intensity $y_i(k+\Delta k)$ of an MR signal associated with the $(k+\Delta k)$th transmission intensity $x(k+\Delta k)$ shifted from k by the signal shift $\Delta k$ by a maximum reception intensity $Max(y_i(k+\Delta k))$.

As in Example 1, the processing circuitry 9 compares the reception intensity index values of the plurality of reception channels CHi for each transmission intensity. If all the reception intensity index values fall within the preset error allowable range, the processing circuitry 9 determines that there is no impaired channel in the plurality of reception channels CHi. If all the reception intensity index values include a reception intensity index value which falls outside the error allowable range, the processing circuitry 9 determines that the plurality of reception channels CHi include an impaired channel. Upon determining that there is an impaired channel, the processing circuitry 9 specifies the reception channel CHi associated with the reception intensity index value which falls outside the error allowable range as an impaired channel.

In the case shown in FIG. 3B, since a signal shift occurs in the reception channel CH2, the processing circuitry 9 compares $y_1(k)/Max(y_1(k))$, $y_2(k+\alpha k)/Max(y_2(k))$, $y_3(k)/Max(y_3(k))$, and $y_4(k)/Max(y_4(k))$. Referring to FIG. 3B, since $\Delta k=1$, for example, the processing circuitry 9 compares $y_1(2)/y_1(4)$, $y_2(3)/y_2(5)$, $y_3(2)/y_3(4)$, and $y_4(2)/y_4(4)$. In the case shown in FIG. 3B, $y_1(k)/Max(y_1(k))$, $y_2(k+\Delta k)/Max(y_2(k))$, $y_3(k)/Max(y_3(k))$, and $y_4(k)/Max(y_4(k))$ are almost equal to each other. In this case, the processing circuitry 9 determines that there is no impaired channel CHi.

If no impaired channel CHi is specified, steps S2-5 and S2-6 are skipped.

(Step S2-5)

In the subsequent scan sequence, as in Example 1, the use of the impaired channel CHi is limited. Since the same limiting technique as that in Example 1 can be used, a description of it will be omitted.

(Step S2-6)

As in Example 1, the communication circuitry 72 notifies the control center of information about the impaired channel CHi. The display circuitry 71 may display the information about the impaired channel CHi. If there is no impaired channel CHi, the communication circuitry 72 may notify the control center of the corresponding determination result or the display circuitry 71 may display the determination result.

[Modification]

As described above, in Example 2, the processing circuitry 9 calculates the ratios of the reception intensities of MR signals, other than a peak signal as a reference, to the reception intensity (maximum reception intensity) of the peak signal for each reception channel CHi in consideration of a signal shift. That is, a reference reception intensity is a maximum reception intensity. However, this is not exhaustive. A reference reception intensity may be set to the reception intensity of an MR signal associated with a transmission intensity preceding or succeeding the transmission intensity associated with a processing target MR signal by a predetermined number of transmissions. In this case, the processing circuitry 9 calculates the ratio of a reception intensity associated with a transmission intensity adjacent to the transmission intensity as a processing target to the reception intensity of the processing target MR signal in consideration of a signal shift. That is, in the case shown in FIG. 3B, in the absence of a signal shift, the ratio of the reception intensity is represented by $y_i(k+1)/y_i(k)$, whereas in the presence of a signal shift, the ratio of the reception intensity is represented by $y_i(k+1+\Delta k)/y_i(k+\Delta k)$. Even in such a case, the ratio of the reception intensity is used as a reception intensity index value.

As described above, in Example 2, the processing circuitry 9 sets a maximum reception intensity as a reference reception intensity. However, this is not exhaustive. For example, the reception intensity of an MR signal to be described below may be set as a reference reception intensity.

The processing circuitry 9 specifies an MR signal having a reception intensity equal to or higher than a predetermined ratio with reference to the reception intensity of a peak signal among a plurality of MR signals received by the plurality of coil elements 83Ai. The predetermined ratio can be set to an arbitrary ratio. For example, when the reception intensity of a peak signal is 100%, the predetermined ratio is preferably set to 50% or more. The processing circuitry 9 calculates the barycenter of transmission intensities associated with reception intensities equal to or higher than a specified predetermined ratio. This barycenter is represented by, for example, $$\Sigma[k](x(k)y_i(k))/\Sigma[k](y_i(k)) \text{ (where } k \text{ makes } y_i(k) \text{ equal to or higher than a predetermined ratio)}$$

A transmission intensity corresponding to the barycenter (to be referred to as a barycentric transmission intensity hereinafter) is set as a reference reception intensity. The processing circuitry 9 then calculates the reception intensity index values of MR signals with respect to each reception channel CHi as described above using the barycentric transmission intensity as a reference reception intensity. Note that if there is no MR signal associated with a barycentric transmission intensity, a scan sequence for failure detection processing may be executed again to acquire MR signals associated with the barycentric transmission intensity. In this case, the transmission coil 81A irradiates the subject S with RF pulses having the barycentric transmission intensity under the control of the sequence controller 30. The reception coil 83A then receives MR signals generated from the subject S by the RF pulses via the plurality of coil elements 83Ai. With this operation, the processing circuitry 9 calculates reception intensity index values by using the reception intensities of the MR signals, i.e., the reception intensities associated with the barycentric transmission intensities, as reference reception intensities, as in the above example.

Example 3

FIG. 4A is a flowchart showing a procedure for processing in Example 3 of impaired channel detection processing by the magnetic resonance imaging apparatus 1 according to the first embodiment. In Example 3, impaired channel detection processing is executed by using MR signals having reception intensities equal to or higher than a predetermined reception intensity.

Note that k is a natural number satisfying $1 \leq k \leq n$ (n is a natural number). Processes associated with steps S3-1 and S3-2 are sequentially repeated with respect to transmission intensities, as in steps S1-1 and S1-2 in Example 1, so as to satisfy $$x(k) < x(k+1) \text{ (where } k \leq n-1)$$

in the order of k=1, . . . , n. For the sake of simplicity, Example 3 will describe a case in which n=6.
(Step S3-1)

The transmission/reception circuitry 31 applies a transmission driving signal for a kth transmission intensity x(k) to the transmission coil 81A under the control of the sequence controller 30 based on scan sequence information for impaired channel detection processing. Upon reception of the transmission driving signal, the transmission coil 81A transmits an RF pulse having the kth transmission intensity x(k).
(Step S3-2)

The reception coil 83A receives the MR signal originating from the RF pulse having the transmission intensity x(k) for each coil element 83Ai.

Figure 4B:
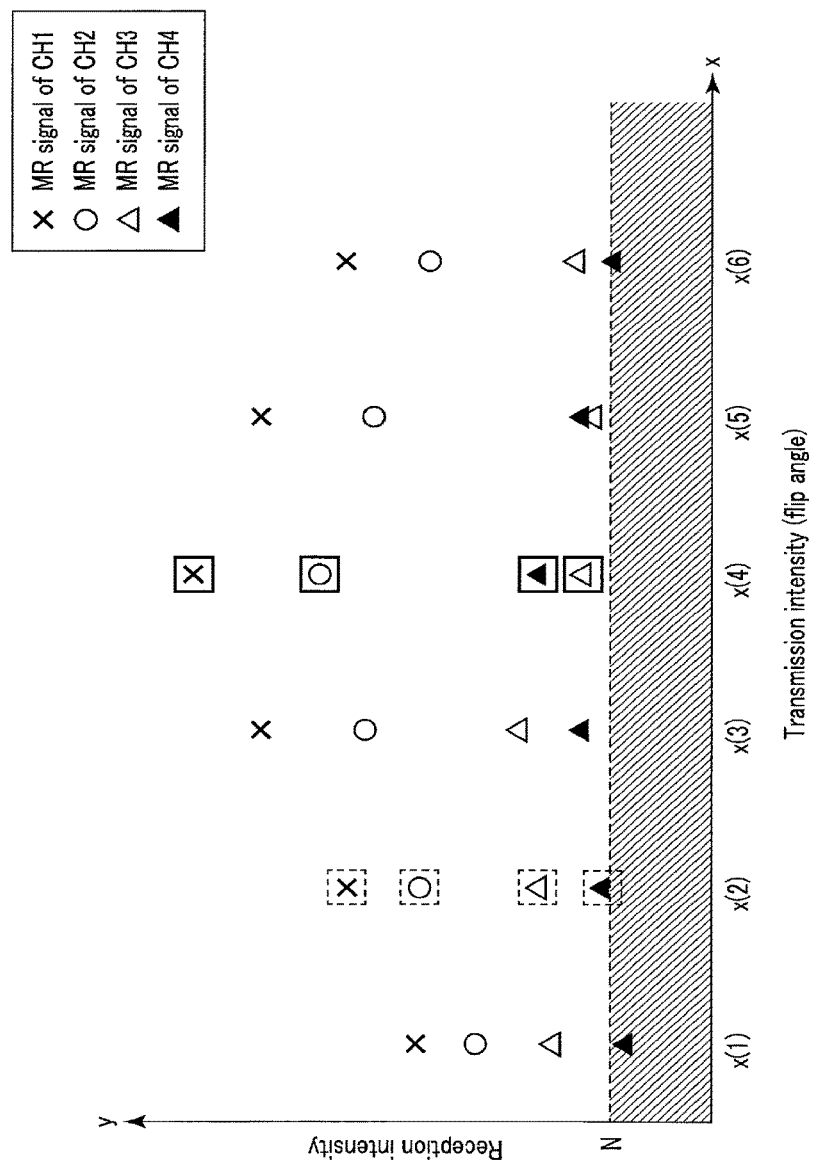
FIG. 4B is a graph showing the relationship between transmission intensity and reception intensity in association with Example 3.

FIG. 4B is a graph showing the relationship between the transmission intensities of RF pulses from the transmission coil 81A and the reception intensities of MR signals received by the respective reception channels CHi in association with impaired channel detection processing in Example 3. Referring to FIG. 4B, the abscissa is defined as a transmission intensity x, and the ordinate is defined as a reception intensity y. As shown in FIG. 4B, upon execution of a scan sequence for impaired channel detection processing, the processing circuitry 9 records the reception intensities y of MR signals from the reception channels CHi for each transmission intensity x(k).
(Step S3-3)

The processing circuitry 9 compares reception intensities $y_i(k)$ of the plurality of received MR signals with a predetermined threshold N, and extracts MR signals having the reception intensities $y_i(k)$ higher than the threshold N from the plurality of received MR signals. Assume that in this case, the predetermined threshold N is an intensity that a signal (noise signal) output from each reception channel CHi can have when the transmission intensity is 0, i.e., no RF pulse is applied. In other words, the processing circuitry 9 excludes MR signals having reception intensities lower than the threshold N from the received MR signals to calculate reception intensity index values (to be described later). In the case shown in FIG. 4B, the processing circuitry 9 excludes an MR signal having a reception intensity $y_4(1)$ from a reception channel CH4 associated with a transmission intensity x(1) and an MR signal having a reception intensity $y_4(6)$ from a reception channel CH6 associated with a transmission intensity x(6) because their reception intensities are lower than the threshold N. In this manner, the processing circuitry 9 can exclude noise signals from a plurality of received MR signals.
(Step S3-4)

The processing circuitry 9 calculates the reception intensity index values of MR signals with respect to the respective reception channels CHi for each transmission intensity x(k). In this example, reception intensity index values are defined as the ratios of reception intensities associated with each transmission intensity to reception intensities associated with reference reception intensities. That is, the ratio of the reception intensity $y_i(k)$ to a reference reception intensity $y_i(S)$ is defined by $y_i(k)/y_i(S)$. Note however that the processing circuitry 9 calculates reception intensity index values of only the MR signals extracted in step S3-3. In other words, the processing circuitry 9 does not calculate the reception intensity index values of the MR signals excluded in step S3-3. For example, in the case shown in FIG. 4B, since the MR signals associated with $y_4(1)$ and $y_4(6)$ are excluded, ratios associated with these reception intensities are not calculated.

As in Examples 1 and 2, the processing circuitry 9 then compares the reception intensity index values of the plurality of reception channels CHi for each transmission intensity. If all the reception intensity index values fall within the preset error allowable range, the processing circuitry 9 determines that there is no defect in the plurality of reception channels CHi. If all the reception intensity index values include a reception intensity index value which falls outside the error allowable range, the processing circuitry 9 determines that the plurality of reception channels CHi include an impaired channel. Upon determining that there is an impaired channel, the processing circuitry 9 specifies the reception channel CHi associated with the reception intensity index value which falls outside the error allowable range as an impaired channel.

In the case shown in FIG. 4B, the processing circuitry 9 compares ratios $y_1(k)/y_1(S)$, $y_2(k)/y_2(S)$, $y_3(k)/y_3(S)$, and $y_4(k)/y_4(S)$. If, for example, a reference transmission intensity x(s) is a second transmission intensity x(2), the processing circuitry 9 compares ratios $y_1(4)/y_1(2)$, $y_2(4)/y_2(2)$, $y_3(4)/y_3(2)$, and $y_4(4)/y_4(2)$. In the case shown in FIG. 4B, although $y_1(4)/y_1(2)$, $y_2(4)/y_2(2)$, and $y_4(4)/y_4(2)$ are almost equal to each other, $y_3(4)/y_3(2)$ differs from $y_1(4)/y_1(2)$, $y_2(4)/y_2(2)$, and $y_4(4)/y_4(2)$ by a degree exceeding an error allowable range. That is, the processing circuitry 9 specifies CH3 as an impaired channel.

If no impaired channel is specified, steps S3-5 and S3-6 are skipped.
(Step S3-5)

In the subsequent scan sequence, as in Examples 1 and 2, the use of the impaired channel is limited. Since the same limiting technique as that in Examples 1 and 2 can be used, a description of it will be omitted.
(Step S3-6)

As in Examples 1 and 2, the communication circuitry 72 notifies the control center of information about the impaired channel CHi. The display circuitry 71 may display the information about the impaired channel CHi. If there is no impaired channel CHi, the communication circuitry 72 may notify the control center of the corresponding determination result or the display circuitry 71 may display the determination result.

[Modification]

As described above, in Example 3, the processing circuitry 9 calculates the ratios of the reception intensities of the respective MR signals to reference reception intensities. That is, a reference reception intensity is fixed for each reception channel. However, this is not exhaustive. For example, a reference reception intensity may be set to the reception intensity of an MR signal associated with a transmission intensity preceding or succeeding the transmission intensity associated with a processing target MR signal by a predetermined number of transmissions.

As described above, in Example 3, the processing circuitry 9 calculates the ratios of the reception intensities of MR signals, other than a reference MR signal, to the reception intensity (reference reception intensity) of the reference MR signal. In this case, a reference reception intensity may be determined in the following manner. First of all, the processing circuitry 9 extracts MR signals having reception intensities exceeding the threshold N and corresponding to the minimum and maximum transmission intensities from a plurality of MR signals acquired by the execution of a scan sequence for failure detection processing. For example, referring to FIG. 4B (CH4), such MR signals correspond to MR signals having reception intensities $y_2(2)$ and $y_2(5)$. The processing circuitry 9 then specifies an MR signal associated with a transmission intensity between the transmission intensities associated with the extracted minimum and maximum MR signals. More specifically, the transmission intensity between these transmission intensities is preferably set to a statistical value such as the median value or average value of the transmission intensities associated with the minimum and maximum MR signals. For example, in the case shown in FIG. 4B, since an MR signal having the reception intensity $y_2(2)$ is extracted as the minimum MR signal and an MR signal having the reception intensity $y_2(5)$ is extracted as the maximum MR signal, an MR signal associated with $y_2(3)$ or $y_2(4)$ is specified as an MR signal associated with the transmission intensity between the minimum and maximum transmission intensities. The processing circuitry sets the reception intensity of the specified MR signal as a reference reception intensity.

(Continuous Wave)

In Examples 1, 2, and 3, RF waves transmitted from the transmission coil 81A are discrete RF pulses. As described above, however, RF waves transmitted from the transmission coil 81A may be continuous RF waves. Processing by the magnetic resonance imaging apparatus 1 in this case will be briefly described below.

FIG. 5 is a graph corresponding to FIG. 2B and showing the relationship between transmission intensity and reception intensity when RF waves are continuous waves. The transmission/reception circuitry 31 controls the transmission coil 81A to change the flip angle of a nucleus to be excited by an RF wave transmitted from the transmission coil 81A. More specifically, an RF wave having a predetermined transmission magnetic field strength is transmitted over a time corresponding to a transmission intensity. Assume that the flip angle of a nucleus becomes 10° when an RF wave having a transmission intensity of 10 kw is applied. In this case, when an RF wave having a transmission intensity of 10 kw is applied to the nucleus over 1 sec, the flip angle becomes 10°. When this wave is applied to the nucleus over 2 sec, the flip angle becomes 20°. After an RF wave is transmitted over a predetermined period of time, the plurality of reception channels CHi receive MR signals generated from the subject S. Repeating transmission and reception of an RF wave while changing the transmission time makes the reception channels receive a plurality of reception signals corresponding to a plurality of flip angles, i.e., transmission intensities.

As shown in FIG. 5, the processing circuitry 9 records reception intensities y of MR signals from the reception channels CHi for each transmission intensity x(k), i.e., each flip angle. Thereafter, the processing circuitry 9 performs impaired channel determination and the like by performing processing similar to that in steps S1-3, S1-4, and S1-5 in FIG. 2A.

As described above, according to this embodiment, even when RF waves are continuous waves, it is possible to specify an impaired channel by processing similar to that using pulse waves.

The magnetic resonance imaging apparatus 1 according to the first embodiment provides the following effects.

The magnetic resonance imaging apparatus according to the first embodiment includes the transmission coil 81A, the plurality of reception channels CHi, the transmission/reception circuitry 31, and the processing circuitry 9. The transmission coil 81A transmits RF waves to the subject S. The plurality of reception channels CHi receive MR signals generated from the subject S. The transmission/reception circuitry 31 controls the transmission coil 81A to change the flip angle of a nucleus contained in the subject S and excited by an RF wave transmitted from the transmission coil 81A. The processing circuitry 9 determines whether the plurality of reception channels CHi include an impaired channel, based on the comparison between the distributions of the signal values of MR signals received by the plurality of reception channels CHi with respect to the flip angles among the plurality of reception channels CHi.

A magnetic resonance imaging apparatus 1 according to another embodiment includes at least an RF coil unit 8A and processing circuitry 9. The RF coil unit 8A includes a plurality of reception channels CHi which receive a plurality of MR signals respectively corresponding to a plurality of RF waves having different transmission intensities. The processing circuitry 9 includes at least an index value obtaining function 91 and an impaired channel determining function 95. By executing the index value obtaining function 91, the processing circuitry 9 obtains a plurality of reception intensity index values respectively corresponding to a plurality of MR signals with respect to the respective reception channels CHi. By executing the impaired channel determining function 95, the processing circuitry 9 determines whether the plurality of reception channels CHi include an impaired channel, based on the comparison between a plurality of reception intensity index values over the plurality of reception channels CHi.

With the above arrangement, the processing circuitry 9 according to this embodiment can determine the presence/absence of an impaired channel based on reception intensity index values based on MR signals acquired by the currently used reception channels CHi whose normality is unknown. Therefore, the magnetic resonance imaging apparatus 1 according to the embodiment can determine the presence/absence of an impaired channel without preparing any prior information such as a sensitivity map concerning normal reception channels, unlike a case in which the presence/absence of an impaired channel is determined in advance based on a sensitivity map concerning normal reception channels. The magnetic resonance imaging apparatus 1 according to the embodiment can easily determine the presence/absence of an impaired channel. Consequently, this makes it possible to reduce the occurrence of artifacts, noise, and the like caused by the impaired channel of a reception channel.

In addition, the magnetic resonance imaging apparatus 1 according to the first embodiment can execute a scan sequence associated with impaired channel detection processing, i.e., acquiring MR signals using a plurality of reception channels while changing transmission intensity, i.e., flip angle, before a main scan for the reconstruction of an MR image provided for an examination. Executing a scan sequence associated with impaired channel detection processing before a main scan makes it possible to determine the presence/absence of an impaired channel before a main scan. This can prevent redoing of a main scan as compared with a case in which a scan sequence associated with impaired channel detection processing is executed during or after a main scan. Note that a scan sequence associated with impaired channel detection processing is preferably executed before a main scan and a positioning scan included in a pre-scan. A positioning scan is a pre-scan for obtaining a locator image, which is required to have a certain image quality. For this reason, the efficiency of an MR examination can be improved by determining the presence/absence of an impaired channel before a positioning scan.

Second Embodiment

The same reference numerals denote constituent elements having almost the same arrangements as those of the magnetic resonance imaging apparatus 1 according to the first embodiment in the following description, and a repetitive description will be made only when necessary.

Figure 6:
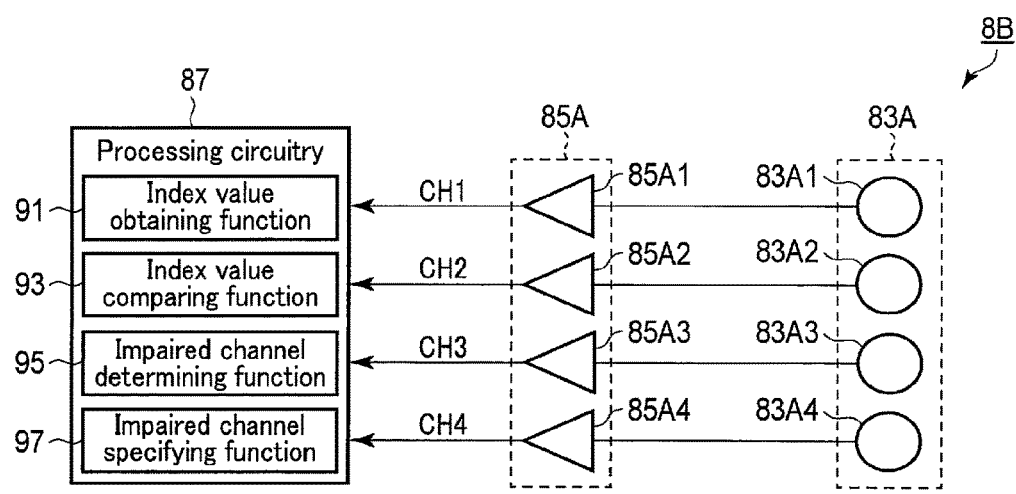
FIG. 6 is a block diagram showing an RF coil apparatus according to the second embodiment.

FIG. 6 is a block diagram showing an RF coil apparatus 8B according to the second embodiment. The RF coil apparatus 8B according to the second embodiment includes a reception coil 83A, amplifying circuitry 85A, and processing circuitry 87.

The processing circuitry 87 functions as the main unit of the RF coil apparatus 8B. The processing circuitry 87 includes, as hardware resources, a processor such as a CPU or MPU and memories such as a ROM and a RAM.

The processing circuitry 87 according to this embodiment is connected to a plurality of reception channels CHi. The processing circuitry 87 receives MR signals acquired by the plurality of reception channels CHi while changing transmission intensity, i.e., flip angle, in a scan sequence associated with impaired channel detection processing. The processing circuitry 87 executes an impaired channel detection program stored in a memory circuitry 21 or the like the processing circuitry 9 according to the first embodiment. By executing the impaired channel detection program, the processing circuitry 87 executes impaired channel detection processing for detecting a failure in the plurality of reception channels CHi. impaired channel detection processing is executed in, for example, a pre-scan. In particular, impaired channel detection processing is preferably executed before a protocol accompanying the obtaining of an image such as a locator image. For impaired channel detection processing, the processing circuitry 87 implements an index value obtaining function 91, an index value comparing function 93, an impaired channel determining function 95, and an impaired channel specifying function 97. Note that since the index value obtaining function 91, the index value comparing function 93, the impaired channel determining function 95, and the impaired channel specifying function 97 are the same as those in the first embodiment, a description of them will be omitted.

As described above, the RF coil apparatus 8B according to the second embodiment includes the plurality of reception channels CHi and the processing circuitry 87. The plurality of reception channels CHi receive MR signals generated from a subject S. The processing circuitry 87 determines whether the plurality of reception channels CHi include an impaired channel, based on the comparison between the distributions of the signal values of MR signals received by the plurality of reception channels CHi with respect to a plurality of flip angles among the plurality of reception channels CHi.

More specifically, the RF coil apparatus 8B includes the plurality of reception channels CHi which receive a plurality of MR signals respectively corresponding to a plurality of RF waves having a plurality of transmission intensities. The processing circuitry 87 includes at least the index value obtaining function 91 and the impaired channel determining function 95. By executing the index value obtaining function 91, the processing circuitry 87 obtains a plurality of reception intensity index values respectively corresponding to a plurality of MR signals with respect to the plurality of reception channels CHi. By executing the impaired channel determining function 95, the processing circuitry 87 determines whether the plurality of reception channels CHi include an impaired channel, based on the comparison between a plurality of reception intensity index values over the plurality of reception channels CHi.

With this arrangement, the RF coil apparatus 8B can also implement alone impaired channel detection processing which is executed by the magnetic resonance imaging apparatus 1 according to the first embodiment. In addition, combining the magnetic resonance imaging apparatus according to the related art and the RF coil apparatus 8B according to the second embodiment makes it possible to implement almost the same effects as those of the magnetic resonance imaging apparatus 1 according to the first embodiment.

Each component of the magnetic resonance imaging apparatus 1 according to the first embodiment and the RF coil apparatus 8B according to the second embodiment is mainly implemented by a combination of a circuit, circuitry, a processor, a memory, and the like. Note that the RF coil apparatus 8B according to the second embodiment may include the transmission coil 81A.

According to at least one of the embodiments described above, it is possible to provide a magnetic resonance imaging apparatus and an RF coil apparatus which enable the grasping of information about a trouble in an RF coil unit.

The word "processor" means circuitry such as a CPU (Central Processing Unit), GPU (Graphics Processing Unit), ASIC (Application Specific Integrated Circuit), programmable logic device (e.g., an SPLD (Simple Programmable Logic Device), a CPLD (Complex Programmable Logic Device), or an FPGA (Field Programmable Gate Array)), or the like. The processor implements functions by reading out programs stored in memory circuitry and executing them. Note that it is possible to directly incorporate programs in the circuitry of the processor instead of storing them in the memory circuitry. In this case, the processor implements functions by reading out programs incorporated in the circuitry and executing them. Note that each processor in this embodiment may be formed as one processor by combining a plurality of independent circuits to implement functions as well as being formed as single circuitry for each processor. In addition, a plurality of constituent elements may be integrated into one processor to implement its function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
   a transmission coil configured to transmit an RF wave to a subject;
   a plurality of reception channels configured to receive MR signals generated from the subject;
   transmission/reception circuitry configured to control the transmission coil to change a flip angle of a nucleus contained in the subject and excited by the transmitted RF wave; and processing circuitry configured to determine whether the plurality of reception channels include an impaired channel, based on a comparison between distributions of signal values of the MR signals with respect to the changing flip angle between the plurality of reception channels.

2. The apparatus of claim 1, wherein the processing circuitry is further configured to specify the impaired channel from the plurality of reception channels based on the comparison.

3. The apparatus of claim 2, further comprising reconstruction circuitry configured to reconstruct an image based on an MR signal received by a reception channel other than the specified impaired channel.

4. The apparatus of claim 2, further comprising display circuitry configured to display information concerning the specified impaired channel.

5. The apparatus of claim 2, further comprising communication circuitry configured to transmit information concerning the specified impaired channel outside.

6. The apparatus of claim 1, wherein the processing circuitry is further configured to
obtain a plurality of signal intensity index values respectively corresponding to a plurality of flip angles of the changing flip angles, with respect to the respective reception channels, based on the MR signals received by the plurality of reception channels, and
determine whether the plurality of reception channels include the impaired channel, based on a comparison between the plurality of signal intensity index values over the plurality of reception channels.

7. The apparatus of claim 6, wherein the processing circuitry is further configured to perform the comparison based on signal intensity index values, of the signal intensity index values, which are not less than a predetermined threshold.

8. The apparatus of claim 7, wherein the predetermined threshold used by the processing circuitry to perform the comparison has a value based on intensities of signals received by the plurality of reception channels when the RF wave is not transmitted.

9. The apparatus of claim 6, wherein the processing circuitry is further configured to
specify a reception intensity of a predetermined MR signal of the received MR signals with respect to each of the plurality of reception channels, and
calculate a ratio of a reception intensity of the received MR signal to the specified reception intensity as the signal intensity index value.

10. The apparatus of claim 9, wherein the processing circuitry is further configured to set, as the predetermined reception intensity, a maximum reception intensity of reception intensities of the received MR signals with respect to each of the plurality of reception channels.

11. The apparatus of claim 9, wherein the processing circuitry is further configured to
specify an MR signal, of the received MR signals, which has a reception intensity not less than a threshold with respect to each of the plurality of reception channels,
specify a first MR signal and a second MR signal which are respectively associated with a maximum transmission intensity and a minimum transmission intensity of reception intensities not less than the threshold, and
set a reception intensity of an MR signal associated with a transmission intensity between the maximum transmission intensity and the minimum transmission intensity as the predetermined reception intensity.

12. The apparatus of claim 9, wherein the processing circuitry is further configured to
specify an MR signal having a reception intensity not less than a predetermined ratio with reference to a maximum reception intensity of reception intensities of the plurality of MR signals,
calculate a barycenter of transmission intensities of MR signals having reception intensities not less than the predetermined ratio, and
set a reception intensity associated with the barycenter as the predetermined reception intensity.

13. An RF coil apparatus, comprising:
a plurality of reception channels configured to receive MR signals generated from a subject; and
processing circuitry configured to determine whether the plurality of reception channels include an impaired channel, based on a comparison between distributions of signal values of the received MR signals with respect to a plurality of flip angles between the plurality of reception channels.

* * * * *